(12) United States Patent
Dutta et al.

(10) Patent No.: US 10,665,667 B2
(45) Date of Patent: May 26, 2020

(54) JUNCTIONLESS/ACCUMULATION MODE TRANSISTOR WITH DYNAMIC CONTROL

(71) Applicant: GLOBALFOUNDRIES INC., Grand Cayman (KY)

(72) Inventors: Anupam Dutta, Kolkata (IN); John J. Ellis-Monaghan, Grand Isle, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/103,357

(22) Filed: Aug. 14, 2018

(65) Prior Publication Data

US 2020/0058734 A1    Feb. 20, 2020

(51) Int. Cl.
*H01L 29/06* (2006.01)
*H01L 29/78* (2006.01)
*H01L 29/66* (2006.01)

(52) U.S. Cl.
CPC .... *H01L 29/0619* (2013.01); *H01L 29/66484* (2013.01); *H01L 29/7832* (2013.01); *H01L 29/7841* (2013.01); *H01L 29/0653* (2013.01)

(58) Field of Classification Search
CPC ............. H01L 29/0619; H01L 29/0653; H01L 29/66484; H01L 29/7832; H01L 29/7841
See application file for complete search history.

(56) References Cited

U.S. PATENT DOCUMENTS

| | | | |
|---|---|---|---|
| 8,010,591 B2 | 8/2011 | Mojarradi et al. | |
| 8,803,233 B2 | 8/2014 | Cheng et al. | |
| 2001/0028089 A1* | 10/2001 | Adan | H01L 29/7841 257/347 |
| 2008/0001658 A1* | 1/2008 | Mojarradi | G06G 7/16 327/581 |
| 2009/0189228 A1* | 7/2009 | Zhang | H01L 29/1095 257/402 |
| 2010/0276662 A1 | 11/2010 | Colinge | |
| 2012/0193719 A1* | 8/2012 | Or-Bach | H01L 21/6835 257/368 |
| 2012/0305893 A1 | 12/2012 | Colinge | |
| 2017/0154895 A1* | 6/2017 | Huo | H01L 27/1157 |
| 2018/0026099 A1* | 1/2018 | Miyamoto | H01L 23/5226 257/77 |

(Continued)

OTHER PUBLICATIONS

Jean-Pierre Colinge, "Conduction Mechanisms in Thin-Film Accumulation-Mode SO1 p-Channel MOSFET's", IEEE Transactions on Electron Devices. vol. 37. No. 3. Mar. 1990, 6 pages.

(Continued)

*Primary Examiner* — Allan R Wilson
(74) *Attorney, Agent, or Firm* — Anthony Canale; Andrew M. Calderon; Roberts Calderon Safran & Cole, P.C.

(57) ABSTRACT

The present disclosure relates to a semiconductor device, and more particularly, to a junctionless/accumulation mode transistor with dynamic control and method of manufacturing. The circuit includes a channel region and a threshold voltage control on at least one side of the channel region, the threshold voltage control being configured to provide dynamic control of a voltage threshold, leakage current, and breakdown voltage of the circuit, wherein the threshold voltage control is a different dopant or material of a source region and a drain region of the circuit.

20 Claims, 13 Drawing Sheets

(56) References Cited

U.S. PATENT DOCUMENTS

2018/0090626 A1* 3/2018 Yamashita .......... H01L 29/7851

OTHER PUBLICATIONS

J. P. Colinge, "Thin-film, Accumulation-Mode p-channel SOI MOSFETs", Electronic Letters, vol. 24 No. 5, Mar. 1988, 2 pages.
Seth J. Wilk, "32 dBm Power Amplifier on 45 nm SOI CMOS", IEEE Microwave and Wireless Components Letters, vol. 23, No. 3, Mar. 2013, 3 pages.
S. Cristoloveanu et al., "The Four-Gate Transistor", Department of Electrical and Computer Engineering, ESSDERC 2002, 4 pages.
Hossein Aghababa et al., "G4-FET modeling for circuit simulation by adaptive neuro-fuzzy training systems", IEICE Electronics Express, vol. 9, No. 10, 881-887, IEICE 2012, 8 pages.
S. Chen et al., "SOI Four-Gate Transistors (G4-FETs) for High Voltage Analog Applications", Proceedings of ESSCIRC, Grenoble, France, 2005, 4 pages.

* cited by examiner

JUNCTIONLESS/ACCUMULATION MODE TRANSISTOR WITH DYNAMIC CONTROL

FIELD OF THE INVENTION

The present disclosure relates to a semiconductor device, and more particularly, to a junctionless/accumulation mode transistor with dynamic control and method of manufacturing.

BACKGROUND

Junctionless transistors (JLTs) provide advantages for sub 100 nanometer dimensions. In particular, JLTs have improved isolation due to low leakage current. Further, JLTs have a lower off capacitance and better linearity due to the absence of a source-drain extension and junctions. JLTs also have lower mobility degradation, which results in a lower on-state resistance.

JLTs and accumulation mode transistors (AMTs) do not have an independent control for dynamic threshold voltage (i.e., Vth) control. The threshold voltage (Vth) is controlled by the process (e.g., gate oxide thickness, Tox, substrate on insulator thickness, Tsi) and/or the material (e.g., flat-band voltage, $V_{FB}$). Further, there is no dynamic control for leakage current (i.e., Ioff) and breakdown voltage (BV).

In JLTs and AMTs, on-state (i.e., on-state current, Ion) and off-state (i.e., Vth, sub-threshold slope) characteristics are inversely related to each other. In other words, the on-state and off-state characteristics vary anti-symmetrically with process parameters (e.g., Channel doping, $N_{ch}$, $V_{FB}$, etc.) In a typical JLT and AMT, a p type (or n type) channel is formed under the gate to electrically connect source and drain. In the typical JLT and AMT, a gate terminal modulates the conductivity of the P channel, which allows the transistor to operate.

SUMMARY

In an aspect of the disclosure, a structure comprises: a circuit including a channel region and a threshold voltage control on at least one side of the channel region, the threshold voltage control being configured to provide dynamic control of a voltage threshold, leakage current, and breakdown voltage of the circuit, wherein the threshold voltage control is a different dopant or material of a source region and a drain region of the circuit.

In another aspect of the disclosure, a circuit comprises: a gate region on a silicon on insulator (SOI) material; a source region adjacent to the gate region; a drain region adjacent to the gate region; a channel region between the source region and the drain region, and underneath the gate region; and a threshold voltage control abutting the channel region on at least one side of the gate region. The threshold voltage control comprises a material different from the source region and the drain region.

In another aspect of the disclosure, a method includes doping a source region and a drain region differently from a threshold voltage control of a junctionless transistor circuit, and dynamically controlling a voltage threshold, leakage current, and breakdown voltage by providing a dc bias at a junction terminal of the junctionless transistor circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
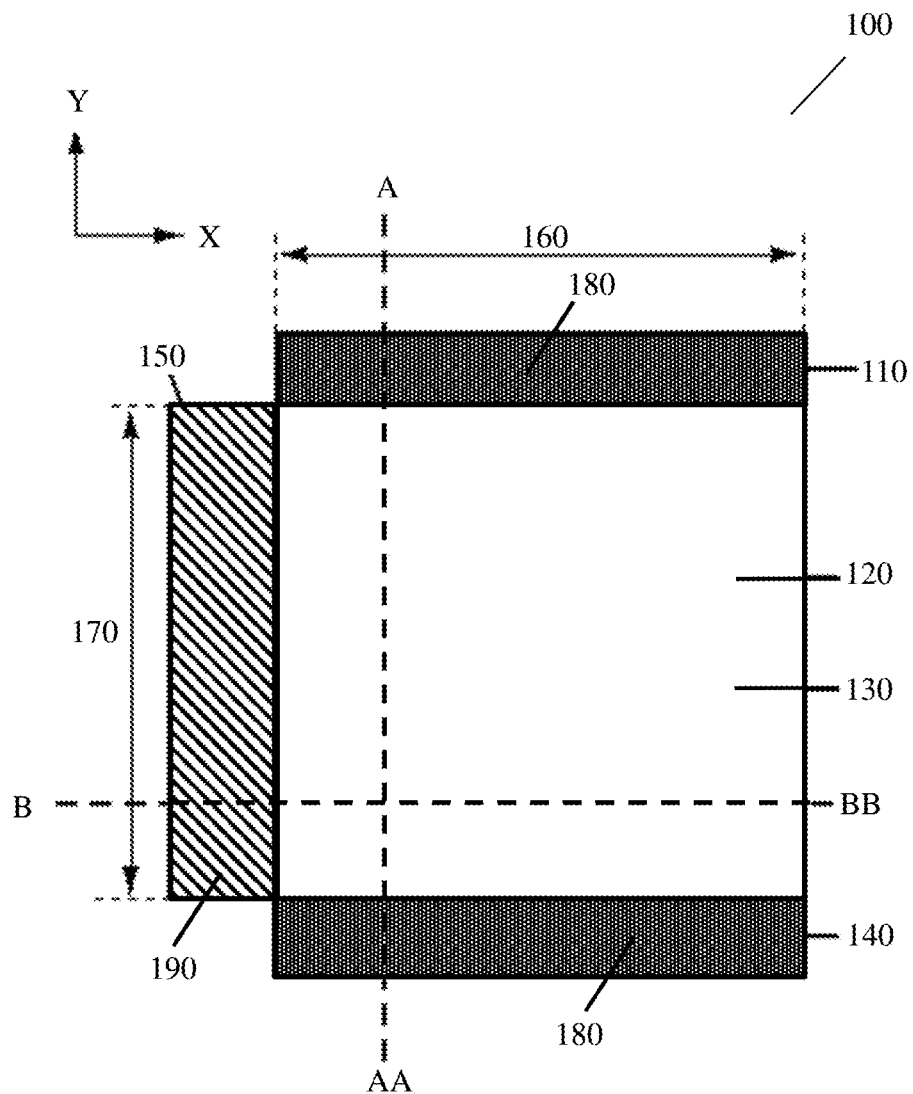
FIG. 1A shows a top view of a junctionless/accumulation mode transistor with dynamic control in accordance with aspects of the present disclosure.

The present disclosure relates to a semiconductor device, and more particularly, to a junctionless/accumulation mode transistor with dynamic control and methods of manufacture. In embodiments, the junctionless/accumulation mode transistor with dynamic control includes one or more P-N junctions formed along an edge of the circuit, which is configured to improve threshold voltage, leakage and breakdown of a circuit. The circuit can provide a high breakdown voltage (BV) for a power amplifier (PA) and the RF switch. Advantageously, by implementing the circuit disclosed herein, the off-state characteristics are improved for a radio frequency (RF) switch and a low-noise amplifier (LNA). Thus, the device of the present disclosure is useful for applications in which linearity and off-state characteristics are important, such as RF switches, LNA, PA, and digital circuits with adaptive threshold shift.

In particular, the off-state characteristics of the circuit described herein include a low overlap and junction capacitance due to the absence of lightly doped drain (LDD) extensions and source-drain junctions. Further, the off-state characteristics include a high off-state impedance, which is achieved by the elimination of a lightly doped drain (LDD) extension and source-drain junction. The absence of the LDD extension results in low gate induced drain leakage (GIDL) current and good linearity. Further, by not having a junction, there is no junction leakage current, which also improves linearity. The low leakage current allows for the device of the present disclosure to be fully depleted in an off-state regardless of the channel length. In comparison, in the conventional circuitry of MOSFET with source and drain junctions, the leakage current in the off state (i.e., Ioff) is determined by diffusion current, gate induced drain leakage (GIDL) current, or diode/bipolar junction transistor (BJT) current (i.e., depending on channel geometry, doping profile, source/drain overlap with the gate, etc.)

Further, by implementing the circuits described herein, the breakdown voltage (BV) is limited by the P-N junction reverse breakdown voltage. In particular, the BV is higher than the conventional circuitry of MOSFET with source and drain junctions due to the absence of parasitic BJT and impact ionization assisted breakdown. Further, in the circuit disclosed herein, the BV is independent of device geometry.

The present disclosure can be effectively utilized for single-gate-silicon on insulator (SOI) technology. For the single-gate-SOI technology, a buried oxide (BOX) and substrate is typically more than 10 times thicker than the front oxide (FOX) and front gate, respectively. Further, the present disclosure can be used for double gate JLTs and AMTs, in which the BOX thickness is similar to the thickness of the FOX with the substrate being highly doped (i.e., acts as a back gate).

Also, in double gate JLTs/AMTs, the threshold voltage Vth control can supplement the back gate. Further, in the double gate application, the FOX and the BOX may have a different or same material, and/or may have a different or same thickness. The front gate and the back gate may also have a different or same material, and/or may have a different or same thickness.

FIG. 1A shows a top view of a junctionless/accumulation mode transistor with dynamic control in accordance with aspects of the present disclosure. In FIG. 1A, a circuit 100 includes a drain region 110, a gate structure 120, a channel 130 underneath the gate structure 120, a source region 140, and a threshold voltage Vth control 150. The gate structure 120 can have a width 160 and length 170 of certain dimensions, depending on the desired characteristics of the device.

In embodiments, the threshold voltage Vth control 150 is a junction formed along an edge of the circuit 100, which is configured to control conductivity between the source and drain regions 140, 110, as well as allowing for dynamic biasing to turn OFF or ON the circuit 100. For example, the threshold voltage Vth control 150 will be set low when the circuit is ON; whereas the threshold voltage Vth control 150 will be set high when the circuit 100 is OFF. The threshold voltage Vth control 150 also allows for dynamic control for threshold voltage Vth, leakage, and breakdown.

In FIG. 1A, the drain region 110 and the source region 140 have a first doping 180, and the threshold voltage Vth control 150 has a second doping 190. In embodiments, the first doping 180 can be a P+ doping, the second doping 190 can be a N+ doping, and the channel 130 can comprise a P channel. In an alternative embodiment, the first doping 180 can be a N+ doping, the second doping 190 can be a P+ doping, and the channel 130 can comprise a N channel.

In an illustrative example, the N+ doping can be provided using phosphorous at an energy of about 10 kilo electron volt, dose of 5e15/cm$^2$ angle and tilt of 0 degree. In another example, the P+ doping can be provided using boron at an energy of about 7 kilo electron volt, dose of 3.5e15/cm$^2$, angle and tilt of 0 degree. In an example, the N doping underneath the gate structure 120 can be provided using Antimony at an energy of about 100 kilo electron volt, dose of 3.3e12/cm$^2$, angle and tilt of 0 degree. In another example, the P doping underneath the gate structure 120 can be provided using boron at an energy of about 10 kilo electron volt, dose of 4.9e12/cm$^2$, angle and tilt of 0 degree.

Figure 1B:
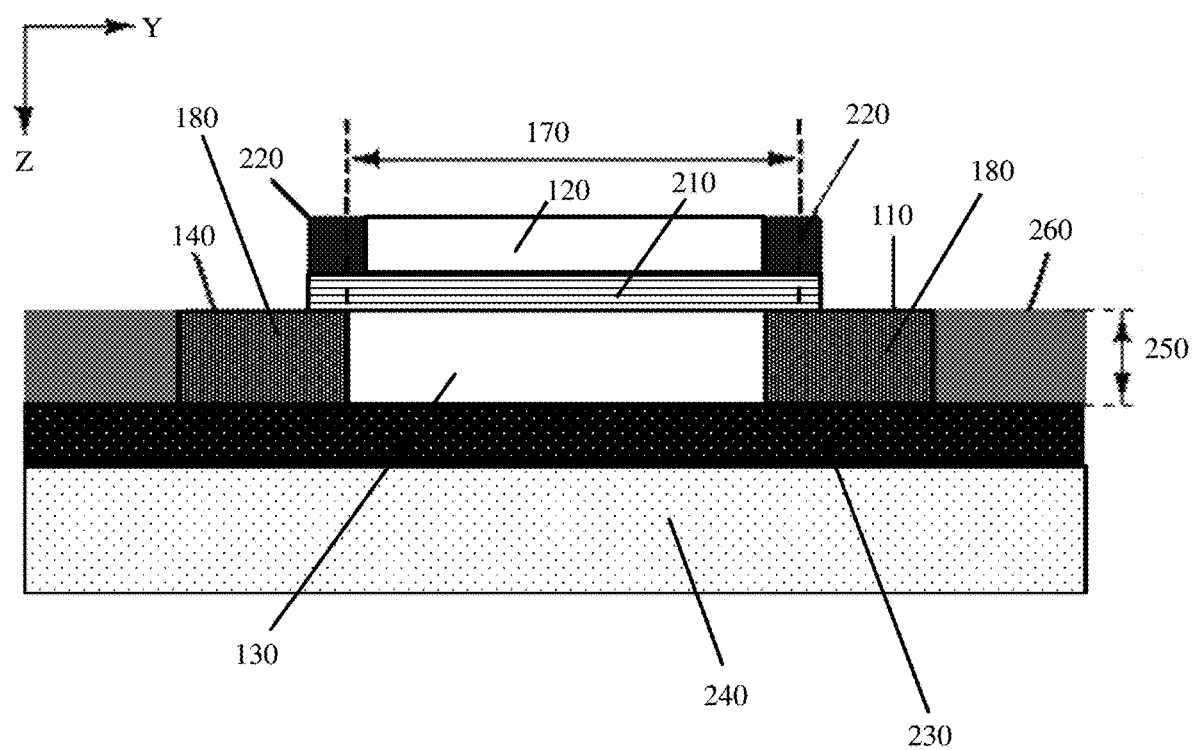
FIG. 1B shows a cross-section view along A-AA of the junctionless/accumulation mode transistor with dynamic control in accordance with aspects of the present disclosure.

FIG. 1B shows a cross section view along A-AA of the junctionless/accumulation mode transistor with dynamic control of FIG. 1A. In FIG. 1B, the channel region 130 is underneath the gate structure 120. The circuit 100 further includes a front oxide 210 underneath the gate structure 120 and underneath a spacer 220 on the sides of the gate structure 220. The front oxide 210 can be a high-k dielectric, such as $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The source region 140 and the drain region 110 are below the front oxide 210 and partially overlap with the spacers 220. Also, the source region 140 and the drain region 110 abut directly against the channel region 130.

The source region 140 and the drain region 110 and the channel region 130 are formed on a substrate (e.g., a semiconductor on insulator). The substrate can be any semiconductor substrate, including, but not limited to, Si, SiGe, SiGeC, SiC, GaAs, InAs, InP, and other III/V or II/VI compound semiconductors. A buried oxide layer (BOX) 230 is provided between the substrate and an underlying substrate material 240. The substrate material 240 can act as a back gate. Shallow trench isolation (STI) regions 260 isolate the circuit 100. A substrate on insulator thickness 250 is also shown in FIG. 1B.

Figure 1C:
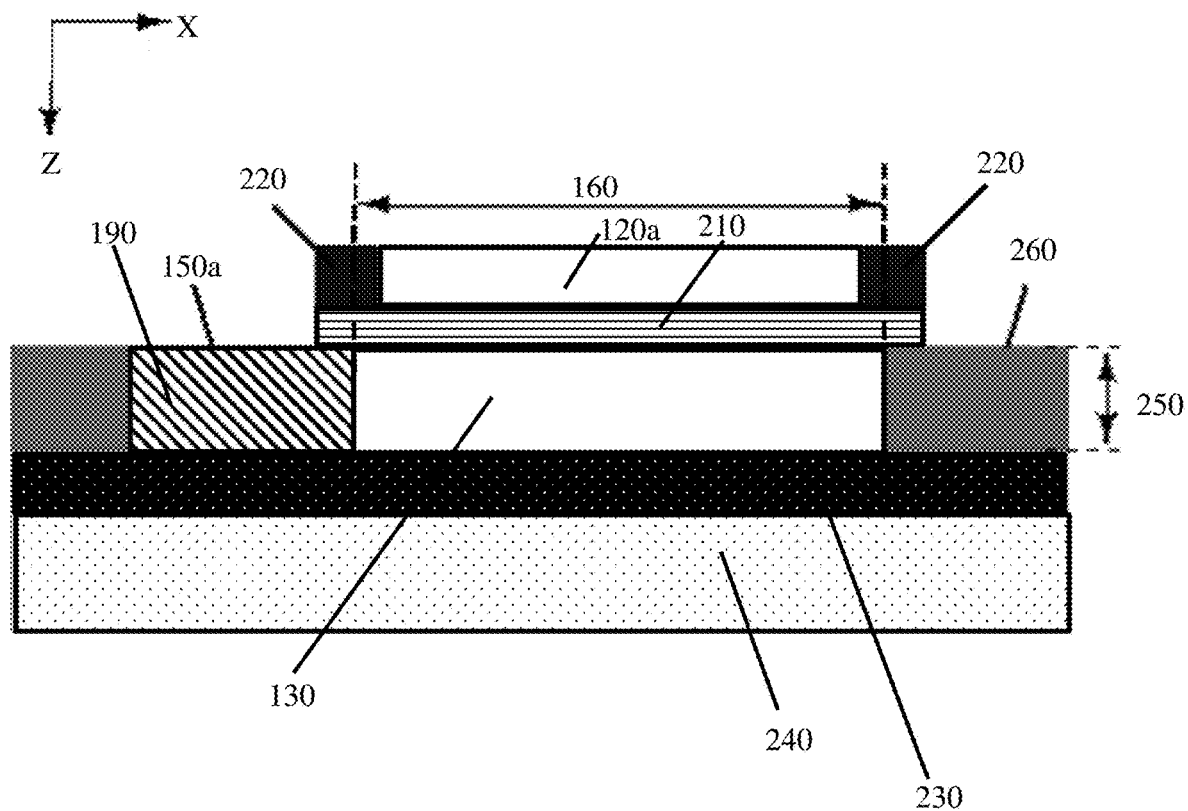
FIG. 1C shows a cross-section view along B-BB of the junctionless/accumulation mode transistor with dynamic control in accordance with aspects of the present disclosure.

FIG. 1C shows a cross-section view along B-BB of the junctionless/accumulation mode transistor with dynamic control of FIG. 1A. As shown in FIG. 1C, the threshold voltage Vth control 150a abuts directly against the channel region 130 and is formed partially under the front oxide 210. The threshold voltage Vth control 150a also partially overlaps the spacer 220. The threshold voltage Vth control 150a is also formed in the substrate on insulator (SOI) and above the BOX 230. A substrate on insulator thickness 250 is also shown in FIG. 1C.

FIG. 1C further shows a metal material 150a which replaces the threshold voltage Vth control 150 (i.e., doped control voltage 150). In particular, the metal material 150a can form a Schottky barrier with silicon. In embodiments, the metal can be Platinum (Pt), Gold (Au), etc. In addition, any metal silicide Schottky gate 120a can be used to replace the gate-poly-oxide gate. As an alternative, any combination of the threshold voltage Vth control 150, metal material 150a, gate structure 120, and metal silicide Schottky gate 120a is contemplated herein. Thus, the metal material 150a can be used with the gate structure 120 or the threshold voltage Vth control 150 can be used with the metal silicide Schottky gate 120a.

Figure 2:
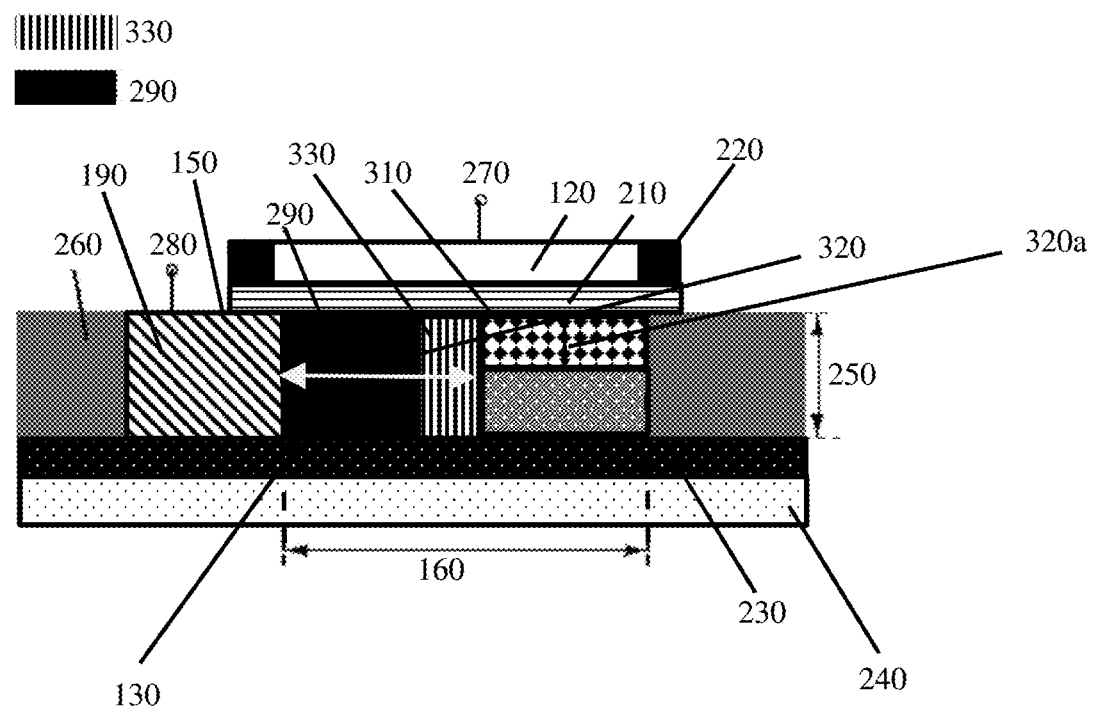
FIG. 2 shows a depletion region of the junctionless/accumulation mode transistor with dynamic control in accordance with aspects of the present disclosure.

FIG. 2 shows the circuit of FIG. 1C with a depletion region under the gate structure 120. In FIG. 2, the circuit 100 includes a contact (Vg) 270 to the gate structure 120 and a contact (Vc) 280 to the threshold voltage Vth control 150. Further, the channel region 130 includes a depletion region 290 for application of a voltage Vc1 at a contact (Vc) 280 and a depletion region 330 is formed by application of a voltage Vc2 at the same contact (Vc) 280. In this case, Vc2 is larger than Vc1. In addition, a vertical depletion layer (Tdep) 310 is formed by a voltage application of the contact (Vg) 270. A depleted region width (Wdep) 320 is also shown as a function of voltage applied at a contact Vc 280. A vertical depletion region thickness (Tdep) 320a of vertical depletion layer 310 is also shown in FIG. 2.

In FIG. 2, the total drain current (i.e., Idrain) is equivalent to the accumulation current (flowing along the surface of the substrate on insulator, Iacc) plus the bulk current (flowing through the substrate on insulator, Ibulk). In comparison to the conventional circuitry of JLT/AMTs without a threshold voltage control, the accumulation current (Iacc) does not change significantly. Therefore, the total drain current (i.e., Idrain) of the circuit described herein is different from the conventional circuitry of JLT/AMTs without a threshold voltage control by the bulk current (i.e., Ibulk). The bulk current (i.e., Ibulk) is set forth in the following equation:

$$I_{bulk} = \frac{q \times N_{ch} \times \mu_{bulk}}{L} \times \int_{0}^{V_D} (W - W_{dep}) \times (T_{si} - T_{dep}) \partial V \quad \text{(equation 1)}$$

In equation 1, q is the charge, $\mu_{bulk}$ is the carrier mobility of the bulk current, $N_{ch}$ is the doping density of the channel, $V_D$ is the drain voltage, Wdep is the lateral depletion width, W is the width, Tdep is the thickness of vertical depletion layer, Tsi is the substrate on insulator thickness, and V is the voltage of the circuit 100. Further, in FIG. 3, the lateral depletion width Wdep in the proposed device gives independent control on the drain current (i.e., Idrain) and the threshold voltage Vth. In contrast, Wdep is not included in an equation of the conventional circuitry of JLT/AMTs without a threshold voltage control. Thus, the conventional circuitry of JLT/AMTs without a threshold voltage control cannot give independent control of the drain current (i.e., Idrain) and the threshold voltage Vth because the conventional circuitry of JLT/AMTs without a threshold voltage control does not include the threshold voltage Vth control 150. In other words, a lateral depletion width Wdep (320) of the depletion region 290 is introduced which provides independent control of the drain current and the threshold voltage Vth. A substrate on insulator thickness 250 is also shown in FIG. 2.

Figure 3:
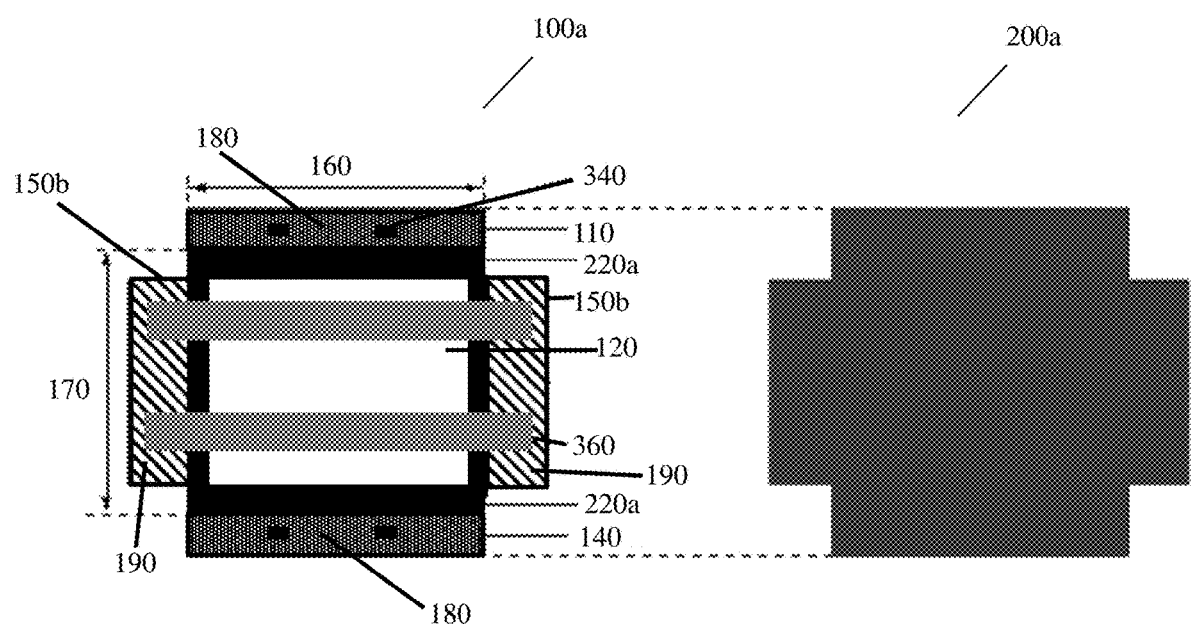
FIG. 3 shows a junctionless/accumulation mode transistor with dynamic control in accordance with additional aspects of the present disclosure.

FIG. 3 shows the junctionless/accumulation mode transistor with dynamic control in accordance with additional aspects of the present disclosure. In FIG. 3, the circuit 100a includes a threshold voltage Vth control 150b on both sides of the circuit 100a, adjacent to the gate structure 120 and on opposing sides of the source and drain regions 140, 110. A spacer 220a separates the threshold voltage Vth control 150b from the source and drain regions 140, 110. Also, contact area 340 is on the source and drain regions 140, 110.

A metal 360 (first level M1) is presented in FIG. 3, and in embodiments, is in contact with the both sides of threshold voltage Vth control area 150b. In FIG. 3, an active area mask 200a is also shown which corresponds with the circuit 100a. In the configuration of FIG. 3, the threshold voltage Vth control 150a is aligned with (e.g., spaced away from) the drain region 110 and the source region 140 to avoid shorting.

Figure 4:
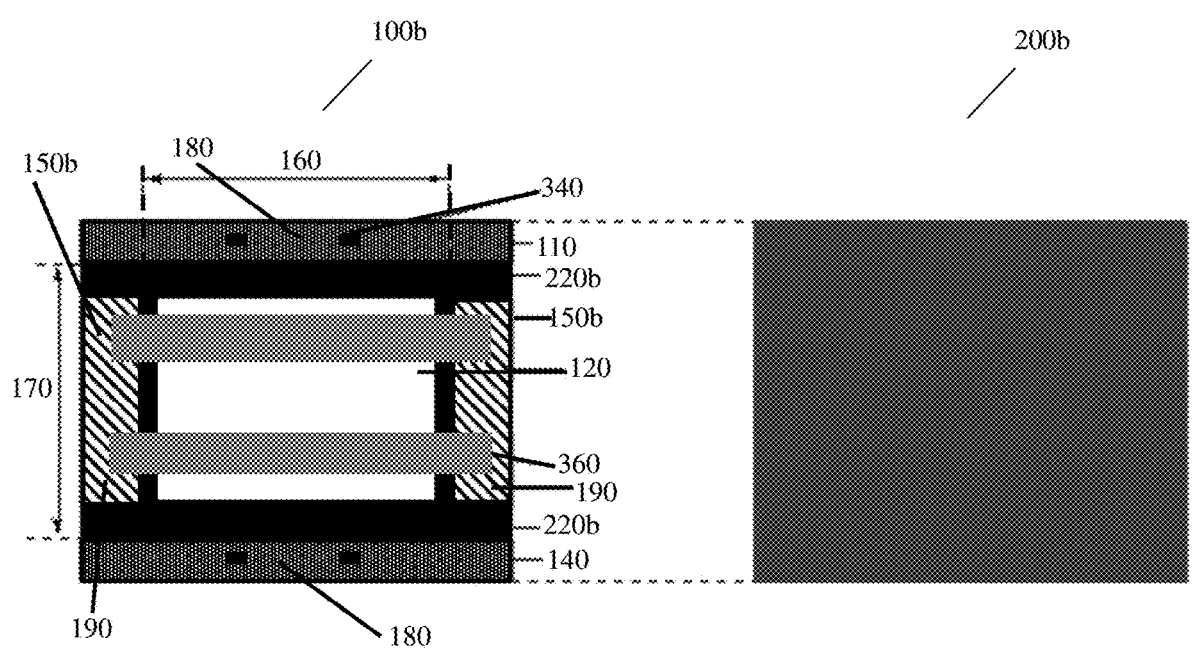
FIG. 4 shows the junctionless/accumulation mode transistor with dynamic control in accordance with additional aspects of the present disclosure.

FIG. 4 shows another junctionless/accumulation mode transistor with dynamic control in accordance with additional aspects of the present disclosure. In FIG. 4, an active area mask 200b is also shown which corresponds with the circuit 100b. In FIG. 4, the circuit 100b is similar to the circuit 100 of FIG. 1A, with the exception that the threshold voltage Vth control 150b is on both lateral sides of the gate structure 120. Spacers 220b extend beyond the gate structure 120, between the threshold voltage Vth control 150b and the source and drain regions 140, 110. This arrangement will prevent shorting between the threshold voltage Vth control 150b and the source and drain regions 140, 110. In the configuration of FIG. 4, the threshold voltage Vth control 150b mask does not require an alignment with the drain and source mask.

Figure 5:
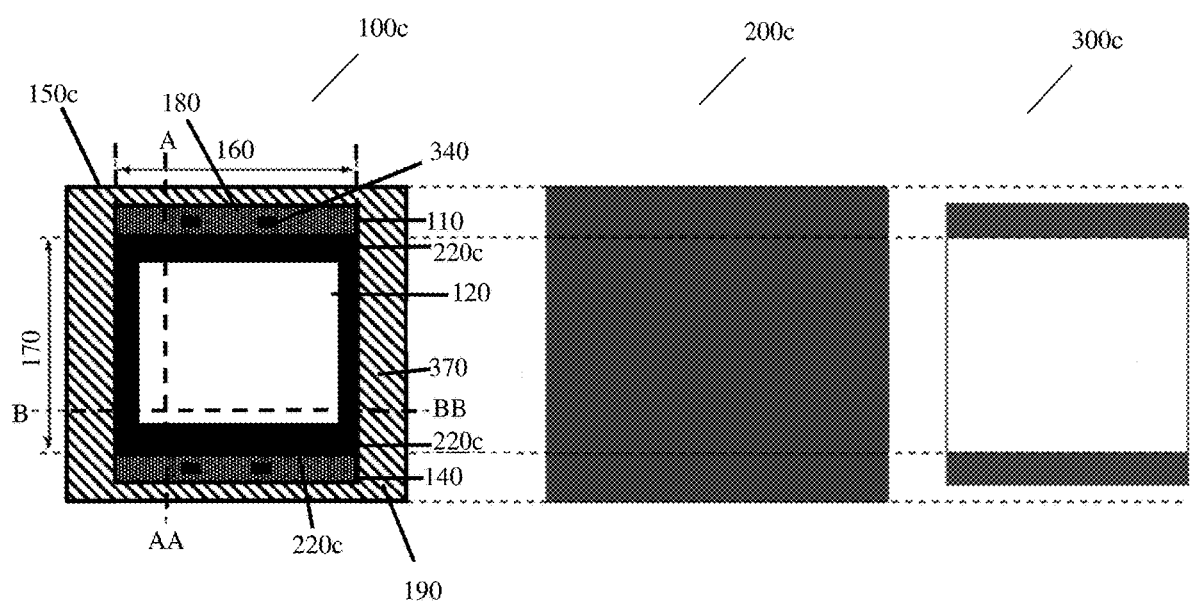
FIG. 5 shows the junctionless/accumulation mode transistor with dynamic control in accordance with additional aspects of the present disclosure.

FIG. 5 shows another junctionless/accumulation mode transistor with dynamic control in accordance with additional aspects of the present disclosure. In FIG. 5, an active area mask 200c and a silicide block mask 300c (area under this mask will not receive silicidation process) are also shown which corresponds with the circuit 100c. In FIG. 5, the circuit 100c is similar to the circuit 100 of FIG. 1A, with the threshold voltage Vth control 150c being on all sides of the gate structure 120. Spacers 220c are provided between the gate structure 120 and the source and drain regions 140,110. A silicidation 370 of the threshold voltage Vth control 150c is also shown in FIG. 5. In the configuration of FIG. 5, there is a silicide block mask 300c on a portion of the drain 110 and the source 140 to prevent electrical shorting between the drain 110, source 140 and the threshold voltage Vth control 150c. Further, as shown in FIG. 5, the silicide block mask 300c will overlay on the portion of the drain 110 and the source 140.

Figure 6:
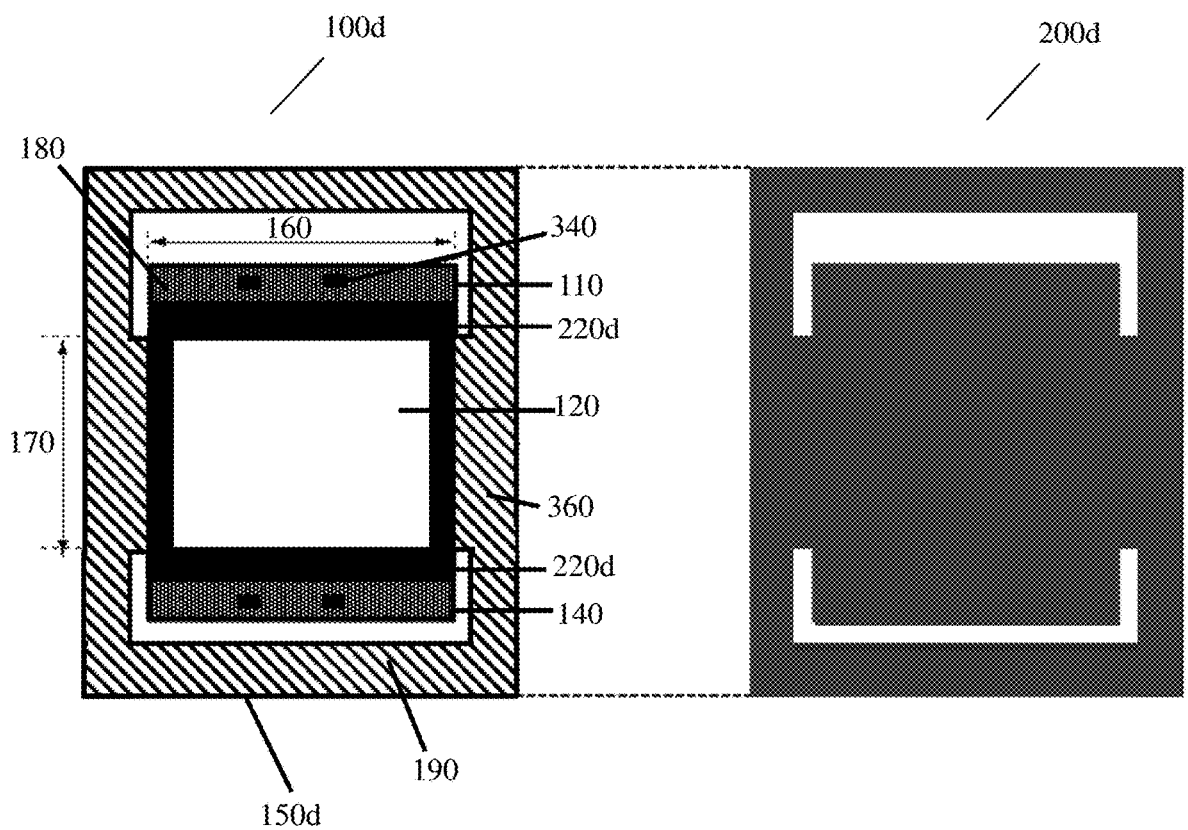
FIG. 6 shows the junctionless/accumulation mode transistor with dynamic control in accordance with additional aspects of the present disclosure.

FIG. 6 shows another junctionless/accumulation mode transistor with dynamic control in accordance with aspects of the present disclosure. In FIG. 6, an active area mask 200d is also shown which corresponds with the circuit 100d. In FIG. 6, the circuit 100d is similar to the circuit 100 of FIG. 1, with the threshold voltage Vth control 150d now on all sides of the gate 120. Spacers 220d are provided between the gate structure 120 and the source and drain regions 140, 110. In the configuration of FIG. 6, there is no need for a silicide block mask. Further, as shown in FIG. 6, the threshold voltage Vth control 150d does not touch the drain region 110 and the source region 140.

Figure 7:
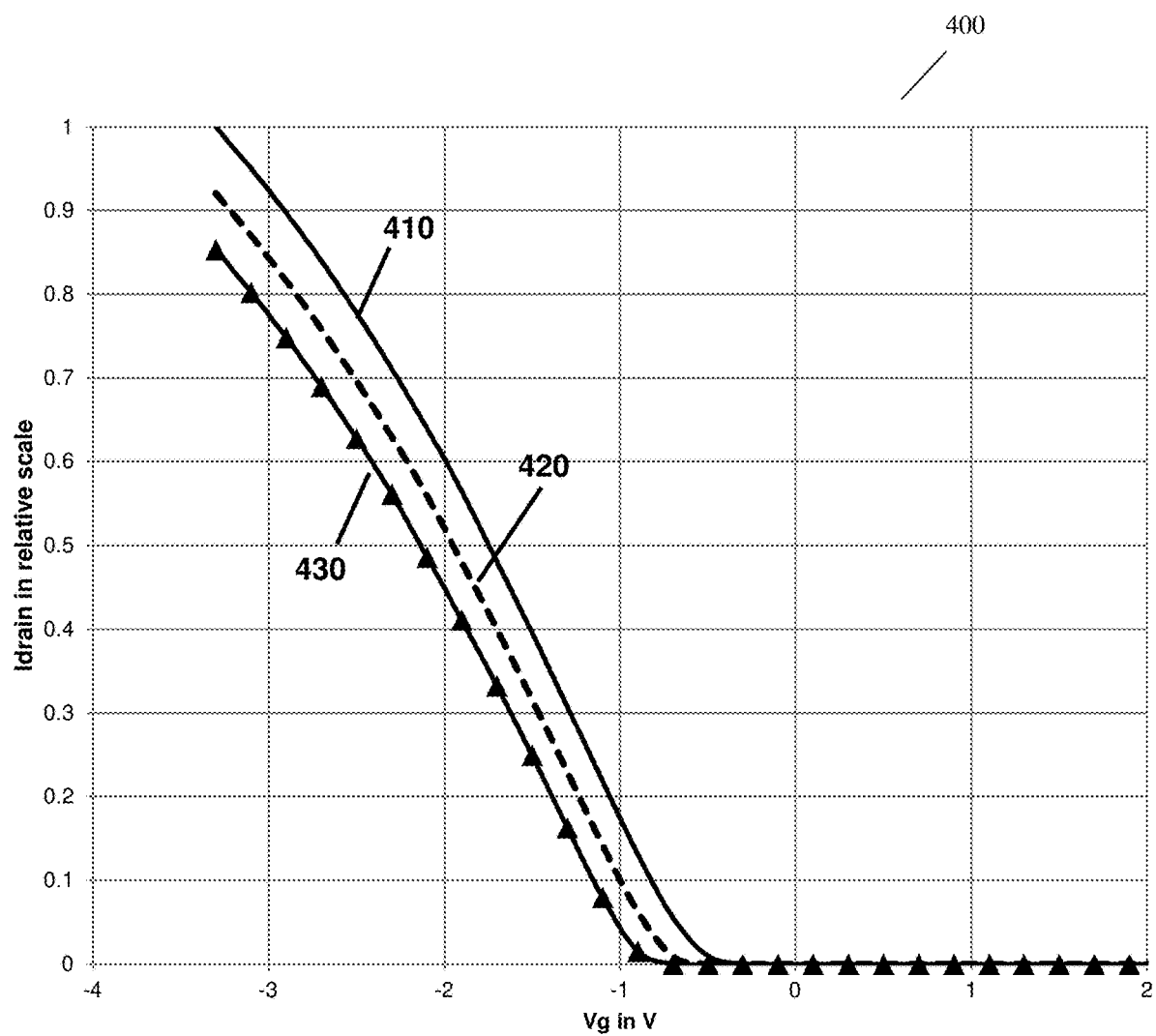
FIG. 7 shows an Id-Vg graph of the junctionless/accumulation mode transistor with dynamic control in accordance with aspects of the present disclosure.

FIG. 7 shows an Id-Vg graph of the junctionless/accumulation mode transistor with dynamic control in accordance with aspects of the present disclosure. In FIG. 7, the x-axis is a gate voltage Vg in volts and the y-axis is a drain current Idrain in a relative normalized scale of amperes. The graph 400 includes line 410 which corresponds to a control voltage Vc of 0 volts, line 420 which corresponds to a control voltage Vc of 0.5 volts, and line 430 which corresponds to a control voltage Vc of 1.0 volt. As shown in FIG. 7, when the control voltage Vc moves from 0 volts to 1 volt, the threshold voltage Vth increases by approximately 0.5 volts and the current Id decreases by approximately 15%.

Figure 8:
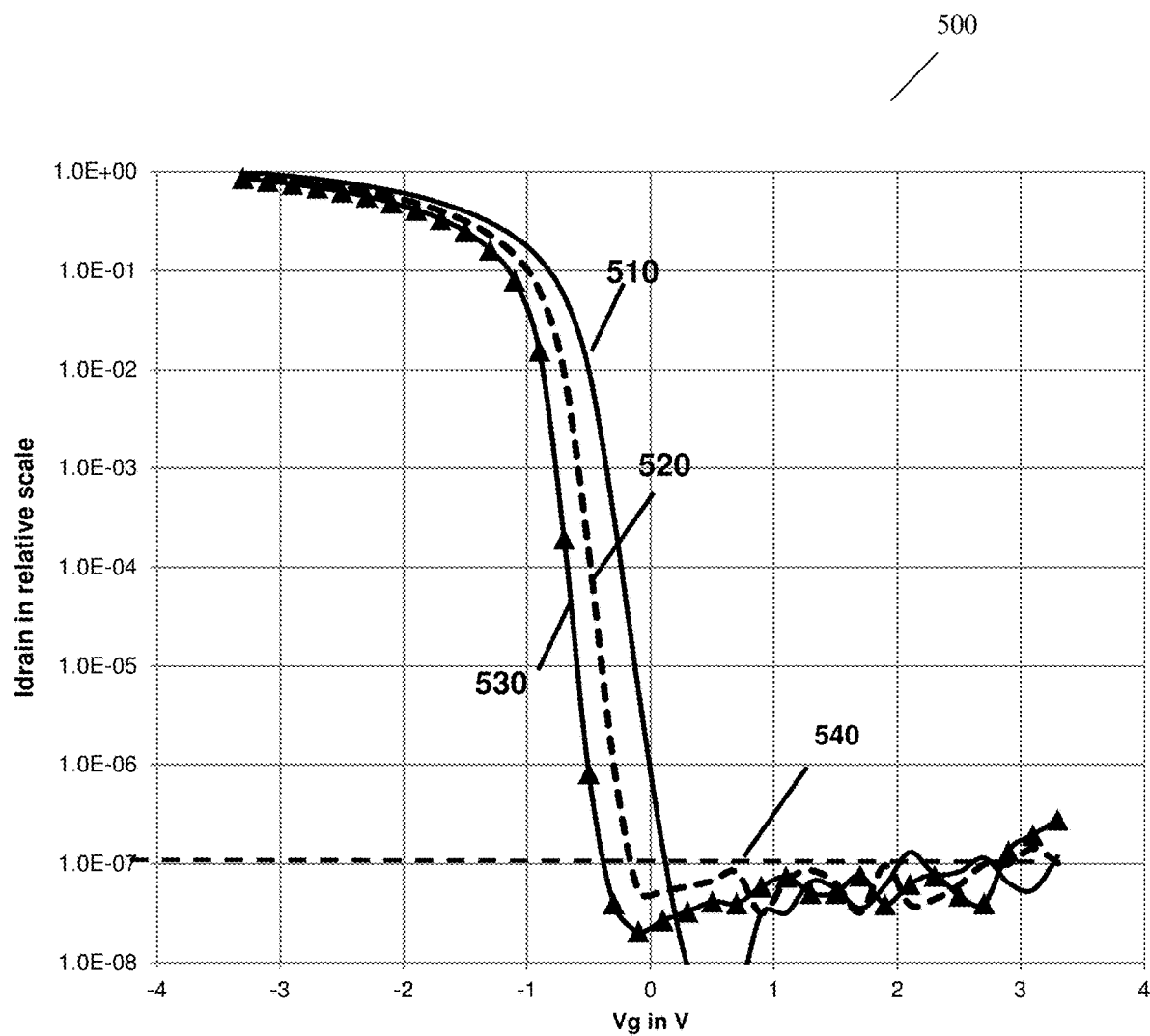
FIG. 8 shows another Id-Vg graph of the junctionless/accumulation mode transistor with dynamic control in accordance with aspects of the present disclosure.

FIG. 8 shows another Id-Vg graph of the junctionless/accumulation mode transistor with dynamic control in accordance with aspects of the present disclosure. FIG. 8 is similar to FIG. 7, except that the y-axis is a drain current Idrain in a relative normalized scale of amperes. The x-axis is the gate voltage Vg in volts. The graph 500 includes line 510 which corresponds to a control voltage Vc of 0 volts, line 520 which corresponds to the control voltage Vc of 0.5 volts, line 530 which corresponds to the control voltage Vc of 1.0 volt, and line 540 which corresponds to a measurement noise floor. Similar to FIG. 7, when the control voltage Vc moves from 0 volts to 1 volt, the threshold voltage Vth increases by approximately 0.5 volts and the current Id decreases by approximately 15%.

Figure 9:
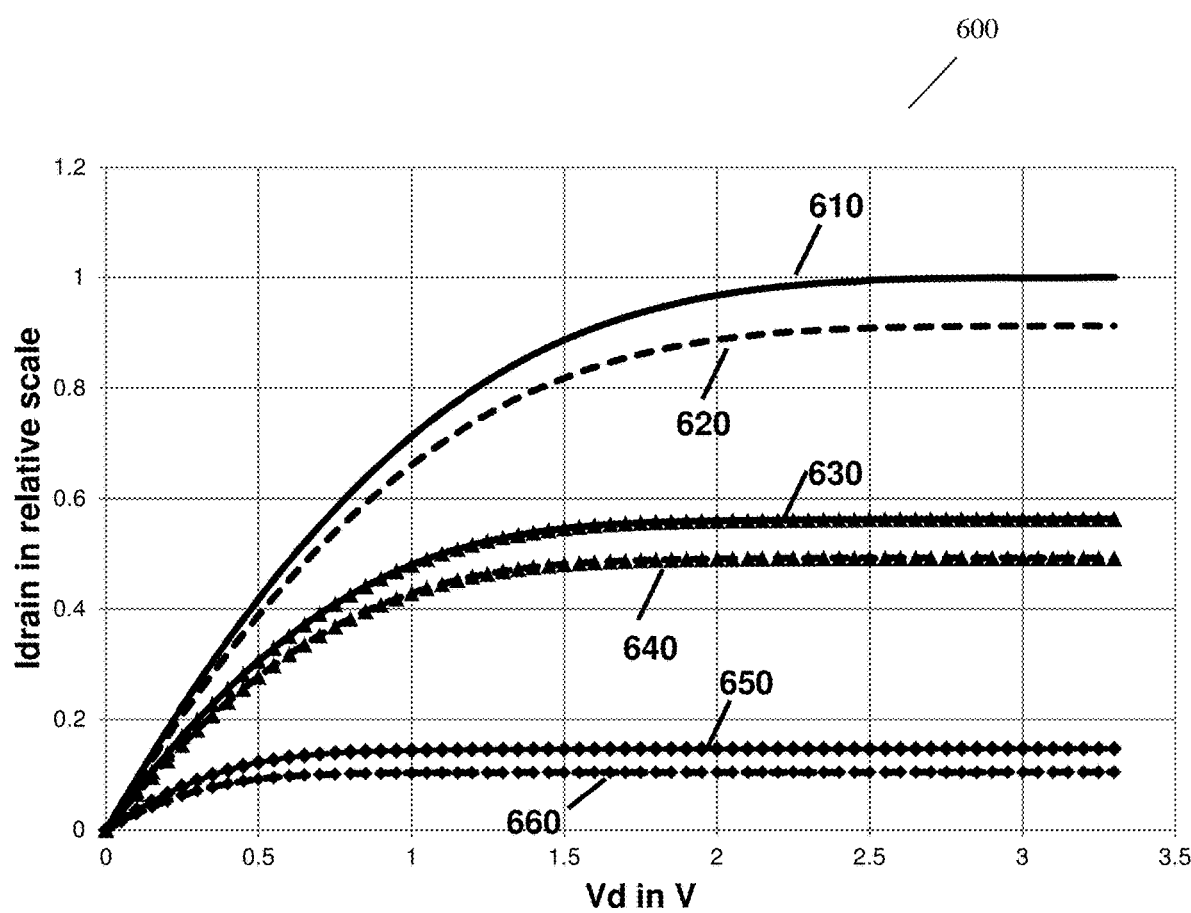
FIG. 9 shows an Id-Vd graph of the junctionless/accumulation mode transistor with dynamic control in accordance with aspects of the present disclosure.

FIG. 9 shows an Id-Vd graph of the junctionless/accumulation mode transistor with dynamic control in accordance with aspects of the present disclosure. In FIG. 9, the x-axis is a drain voltage Vd in volts and the y-axis is a drain current Idrain in a relative normalized scale of amperes. In FIG. 9, the graph 600 shows the effect of the control voltage Vc tuning in the present disclosure on the drain current Id and drain voltage Vd. The graph 600 includes line 610 which corresponds to a gate voltage Vg of −3.3 volts and a control voltage Vc of 0 volts, line 620 which corresponds to the gate voltage Vg of −3.3 volts and the control voltage Vc of 0.5 volts, line 630 which corresponds to the gate voltage Vg of −2.5 volts and the control voltage Vc of 0 volts, and line 640 which corresponds to the gate voltage Vg of −2.5 volts and the control voltage Vc of 0.5 volts. Further, the graph 600 includes line 650 which corresponds to the gate voltage of −1.5 volts and the control voltage Vc of 0 volts and line 660 which corresponds to the gate voltage of −1.5 volts and the control voltage Vc of 0.5 volts.

Figure 10:
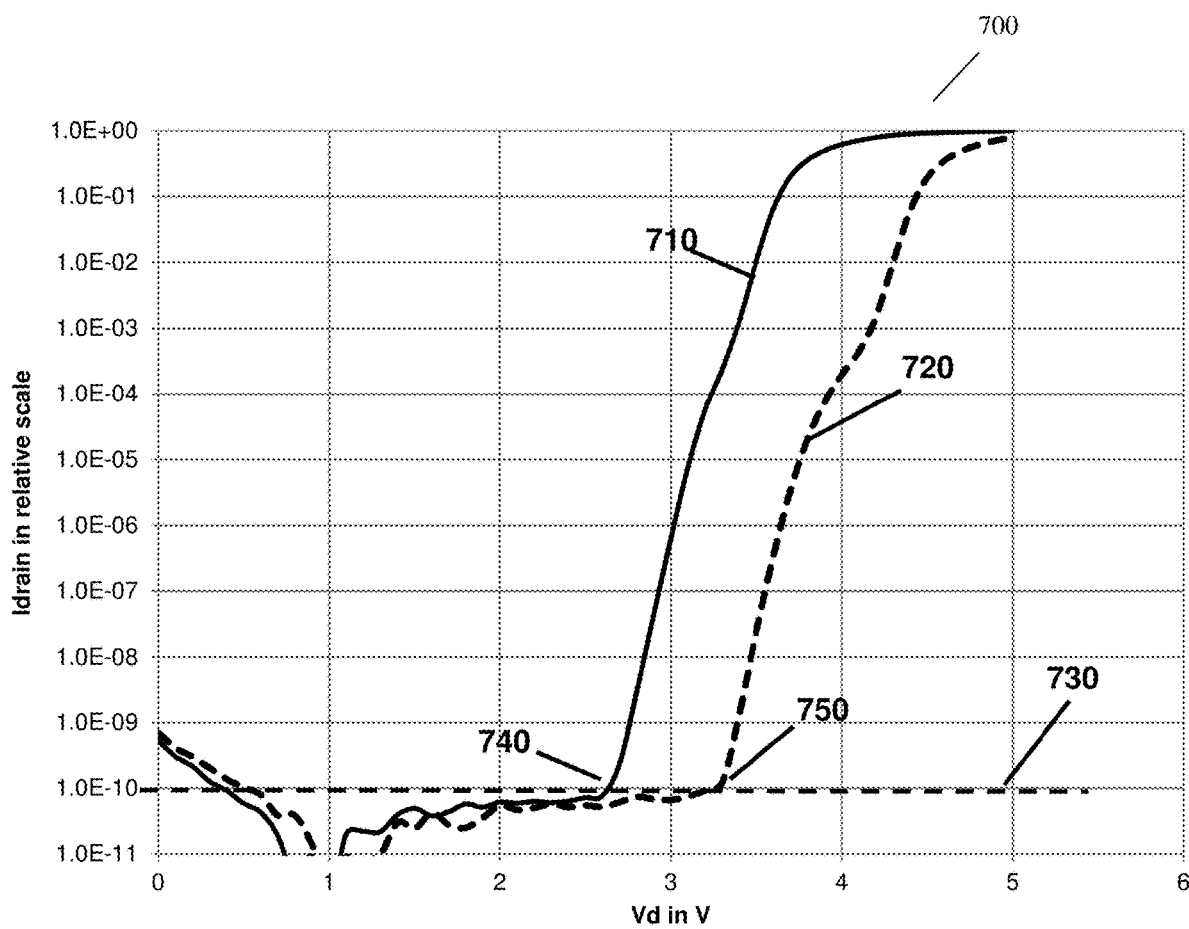
FIG. 10 shows another Id-Vd graph of the junctionless/accumulation mode transistor with dynamic control in accordance with aspects of the present disclosure.

FIG. 10 shows another Id-Vd graph of the junctionless/accumulation mode transistor with dynamic control in accordance with aspects of the present disclosure. In FIG. 10, the x-axis is a drain voltage Vd in volts and the y-axis is a drain current Idrain in a relative normalized scale of amperes. In FIG. 10, the graph 700 shows the effect of the control voltage Vc tuning on the off-state (i.e. the substrate on insulator is fully depleted) breakdown voltage (BV). The graph 700 includes line 710 which corresponds to a control voltage Vc of 2.5 volts, line 720 which corresponds to a control voltage Vc of 3.3 volts, and line 730 which corresponds to a measurement noise floor. In the graph 700, a breakdown voltage (BV) occurs at 2.6 volts (i.e., point 740) for the line 710. A breakdown voltage (BV) occurs at 3.4 volts (i.e., point 750) for the line 720.

Figure 11:
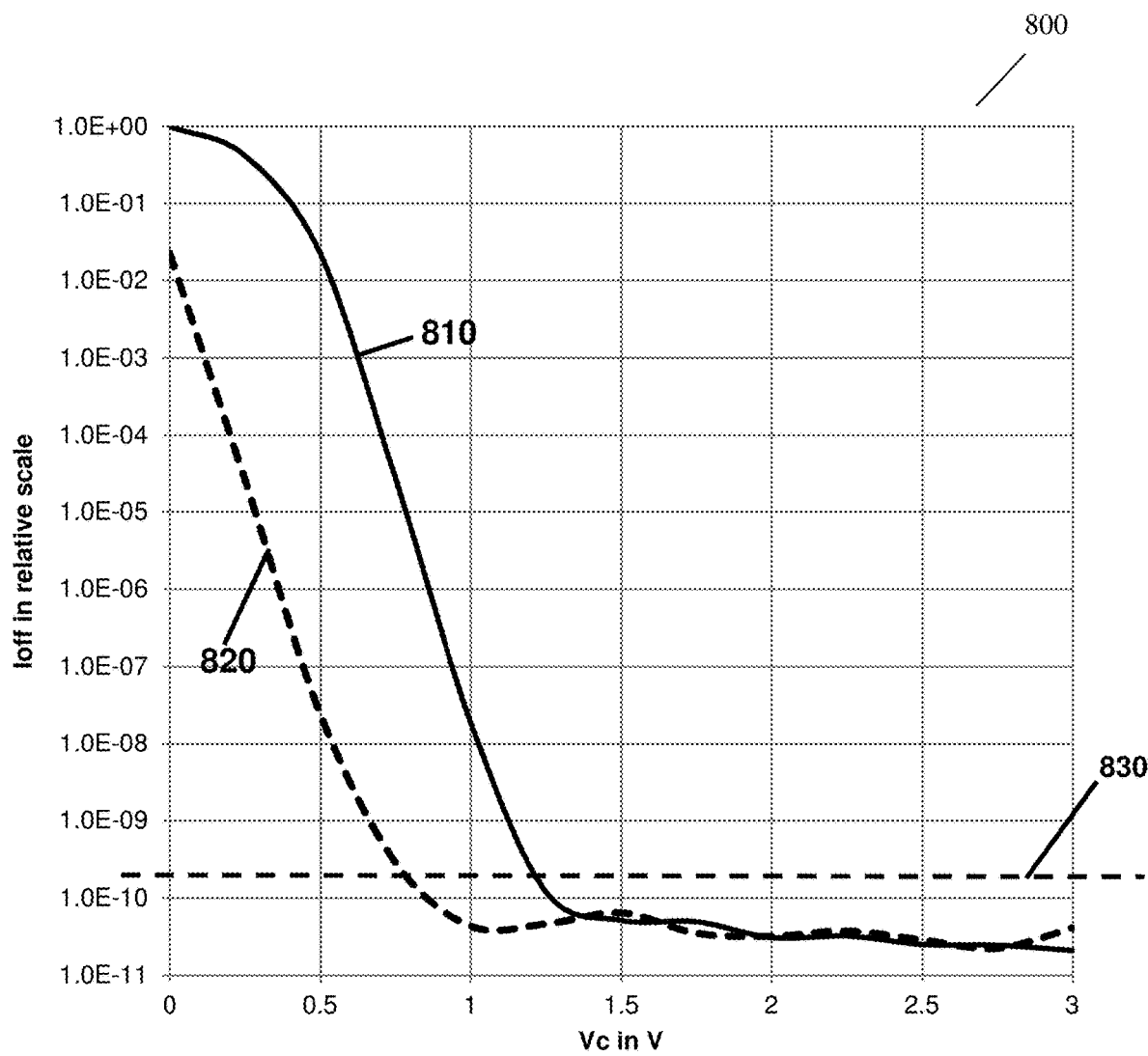
FIG. 11 shows an Ioff-Vc graph of the junctionless/accumulation mode transistor with dynamic control in accordance with aspects of the present disclosure.

FIG. 11 shows an Ioff-Vc graph of the junctionless/accumulation mode transistor with dynamic control in accordance with aspects of the present disclosure. In FIG. 11, the x-axis is a control voltage Vc in volts and the y-axis is a leakage current Ioff (at Vg=0) in a relative normalized scale of amperes. The graph 800 includes line 810 which corresponds to a drain voltage Vd of 1.5 volts, line 820 which corresponds to the drain voltage Vd of 1.0 volt, and a line 830 which corresponds to a measurement noise floor. In FIG. 11, the leakage current Ioff can be controlled by the control voltage Vc. Further, for a minimum leakage current Ioff, the control voltage Vc should be more than the maximum allowed drain voltage for a specific application.

The circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a junctionless/accumulation mode transistor with dynamic control of the present disclosure has been adopted from integrated circuit (IC) technology. For example, the structures are built on wafers and are realized in films of material patterned by photolithographic processes on the top of a wafer. In particular, the fabrication of the circuit and method for a junctionless/accumulation mode transistor with dynamic control uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a circuit including a channel region and a threshold voltage control directly abutting and in direct contact with at least one side of the channel region, the threshold voltage control being configured to provide dynamic control of a voltage threshold, leakage current, and breakdown voltage of the circuit,
   wherein the threshold voltage control is a different dopant or material than a source region and a drain region of the circuit, and
   the circuit is a junctionless transistor circuit.

2. The structure of claim 1, wherein the source region and the drain region are P+ doped, and the threshold voltage control is N+ doped.

3. The structure of claim 1, wherein the source region and the drain region are N+ doped, and the threshold voltage control is P+ doped.

4. The structure of claim 1, wherein the threshold voltage control is a metal material.

5. The structure of claim 1, wherein the circuit includes a metal gate structure comprising the source region, drain region and the channel region.

6. The structure of claim 1, wherein the threshold voltage control provides dynamic control of the voltage threshold, the leakage current, and the breakdown voltage by providing a dc bias at a junction terminal of the transistor circuit.

7. The structure of claim 1, wherein the threshold voltage control is further configured to control conductivity between the source region and the drain region and to dynamically bias the circuit to turn on in response to the threshold voltage control being below a first predetermined threshold voltage level and to turn off in response to the threshold voltage control being above a second predetermined threshold voltage level which is higher than the first predetermined threshold voltage level, and the source and the drain region directly abutting against the channel region.

8. The structure of claim 1, wherein the circuit is an accumulation mode transistor circuit.

9. The structure of claim 1, wherein the threshold voltage control is on both sides of the channel region.

10. The structure of claim 9, further comprising a spacer separating the threshold voltage control with the source region and the drain region of a gate structure of the circuit.

11. The structure of claim 1, wherein the threshold voltage control surrounds the channel region.

12. A circuit, comprising:
    a gate region on a silicon on insulator (SOI) material;
    a source region adjacent to the gate region;

a drain region adjacent to the gate region;

a channel region between the source region and the drain region, and underneath the gate region; and a threshold voltage control directly abutting and in direct contact with the channel region on at least one side of the gate region, wherein the threshold voltage control comprises a material different from the source region and the drain region, and the circuit is a junctionless transistor circuit.

13. The circuit of claim 12, wherein the source region and the drain region are P+ doped, and the threshold voltage control comprises a metal.

14. The circuit of claim 13, wherein the metal is platinum or gold.

15. The circuit of claim 13, wherein the gate region is a metal.

16. The circuit of claim 12, wherein the threshold voltage control surrounds the channel region.

17. The circuit of claim 12, further comprising at least one spacer separating the source region and drain region from the threshold voltage control.

18. The circuit of claim 12, wherein the threshold voltage control is on both sides of the channel region.

19. The circuit of claim 12, wherein the threshold voltage control provides dynamic control of a voltage threshold, a leakage current, and a breakdown voltage by providing a dc bias.

20. A method, comprising:

doping a source region and a drain region differently from a threshold voltage control of a junctionless transistor circuit; and dynamically controlling a voltage threshold, leakage current, and breakdown voltage by providing a dc bias at a junction terminal of the junctionless transistor circuit, wherein the threshold voltage control is directly abutting and in direct contact with a channel region of the junctionless transistor circuit.

* * * * *